United States Patent [19]

Hugenholtz

[11] 4,137,508
[45] Jan. 30, 1979

[54] CHANNEL SELECTION SYSTEM FOR A DISPLACED SPECTRUM FREQUENCY SYNTHESIZER

[76] Inventor: Eduard H. Hugenholtz, 16 Brucedale Crescent, Willowdale, Ontario, Canada, M2K 2C7

[21] Appl. No.: 811,710

[22] Filed: Jun. 30, 1977

[51] Int. Cl.² .............................................. H03B 3/08
[52] U.S. Cl. ......................................... 331/4; 331/19; 331/22; 331/25; 331/31
[58] Field of Search .................... 331/4, 19, 22, 25, 31, 331/3, 1, 24, 78

[56] References Cited
U.S. PATENT DOCUMENTS

| 3,904,980 | 9/1975 | Hugenholtz | 331/19 |
| 3,916,334 | 10/1975 | Hugenholtz | 331/19 |

Primary Examiner—John Kominski

[57] ABSTRACT

A comparator-discriminator is provided, suitable for use with a phaselock control system of a frequency synthesizer, to permit automatic tuning of a variable oscillator to a selected frequency lying within a frequency band for which a phaselock may occur. This system permits the frequency of the variable oscillator to lock-on to an arbitrary value in the range other than the preselected value, at which time the phaselock is broken by an injected signal, thereby permitting the shifting of the oscillator frequency to a value lying closer to the selected frequency value. Upon achievement of phaselock to the selected frequency, in a slightly more elaborate embodiment, the injected signal is inhibited and no further breaking of phaselock can occur. In operation of both the embodiments the comparator-discriminator provides a control signal in the sense of driving the variable oscillator towards the preselected value, using a periodically actuated switch to connect the control signal to the oscillator control system. The two embodiments disclosed have the virtues of simplicity, low cost and enhanced reliability as well as a short channel selection time. A further embodiment of the system relates to a synthesizer with spectrum shift interpolation. In two further embodiments of the same system simplifications are described in which arrangements some functions of the channel selection and interpolation are combined. One of these embodiments employs a phaselock oscillator as the basic frequency source for the channel selection system while the second embodiment employs a system of mixing and filtering.

14 Claims, 10 Drawing Figures

CHANNEL SELECTION SYSTEM FOR A DISPLACED SPECTRUM FREQUENCY SYNTHESIZER

This invention is directed to a frequency synthesizer and in particular to a harmonic selection system in a displaced spectrum frequency synthesizer.

In the art of synthesizers examples of displaced spectrum synthesizers are found in U.S. Pat. Nos. 3,904,980, Sept. 9, 1975 and 3,916,334, Oct. 28, 1975 by the present inventor.

In the first mentioned patent a first oscillator having means to control its output frequency is phaselocked on a harmonic frequency of a reference pulse spectrum, provided by a second oscillator. The phaselock is accomplished using a pulse generator providing a pulse spectrum recurring at a repetition frequency $f_1$. The pulse spectrum is fed to a sample gate or phase-discriminator type mixer.

From the mixer an output signal goes by way of a filter and hunting oscillator arrangement to the frequency control circuit of the first oscillator.

This arrangement permits the first oscillator to phaselock on harmonic frequencies within the control range of the first oscillator lying within the pulse spectrum of the reference frequency.

In order to achieve phaselock of the first oscillator on a preselected harmonic of the frequency $f_1$ an auxiliary pulse spectrum is used. A hunting oscillator that is operable in a hunting mode and a phaselock mode generates a repetitive signal of sawtooth form, which becomes inhibited when in a phaselock mode in response to a beat frequency, to permit locking of the controllable oscillator to the selected harmonic of the reference signal.

An alternative prior arrangement disclosed in the referenced U.S. Pat. No. 3,904,980, in addition to a frequency selective gate also uses a frequency discriminator.

Permanent phaselock of the controlled first oscillator is achieved only when a tentative phaselock is confirmed by a narrow band gate system. Otherwise, when the frequency discriminator detects a beat frequency below the desired value, a positive output voltage from the discriminator is used to drive the variable oscillator in a frequency increasing direction, and vice versa when the beat frequency is too high. While possessing certain desirable functional characteristics this prior art arrangement is somewhat complex and correspondingly costly. Also this complexity makes the system more vulnerable to component malfunction or other incapacity.

The present disclosure is directed to a frequency synthesizer of reduced complexity and enhanced reliability, while being of lower cost.

In accordance with the present disclosure there is provided a frequency-discriminator of the comparator type having a positive output voltage when a first input signal is received having a frequency lower than that of a reference signal. Correspondingly, when the frequency of the first input signal is higher than that of the reference signal, the discriminator provides a negative output voltage.

The use of a discriminator of the type which is not phasesensitive provides an output signal of average value as long as the frequency being controlled has the same value as the frequency of the reference signal, regardless of their phase relationship. An alternative arrangement may be used, with a phase-discriminator phase-discriinator to provide a phasedependent output component when the input signals are identical, and which provides an additional output signal component which changes its state as soon as a phaselocked condition between the input signals is achieved.

The output component of these frequency-discriminators is connected to a storage capacitor through a periodic switched gate system. The storage capacitor has an output connected to the frequency control of the variable oscillator being controlled.

With the alternative arrangement, using the phase-discriminator the additional output signal is connected to the gate system to disable the periodically switched gate system when the condition of phaselock is reached, to preclude any undesired loss of lock. The periodic gate switching is controlled by means of a recurrent signal of relatively low frequency. The storage capacitor mentioned can be located before or after the periodic switch.

Figure 2:
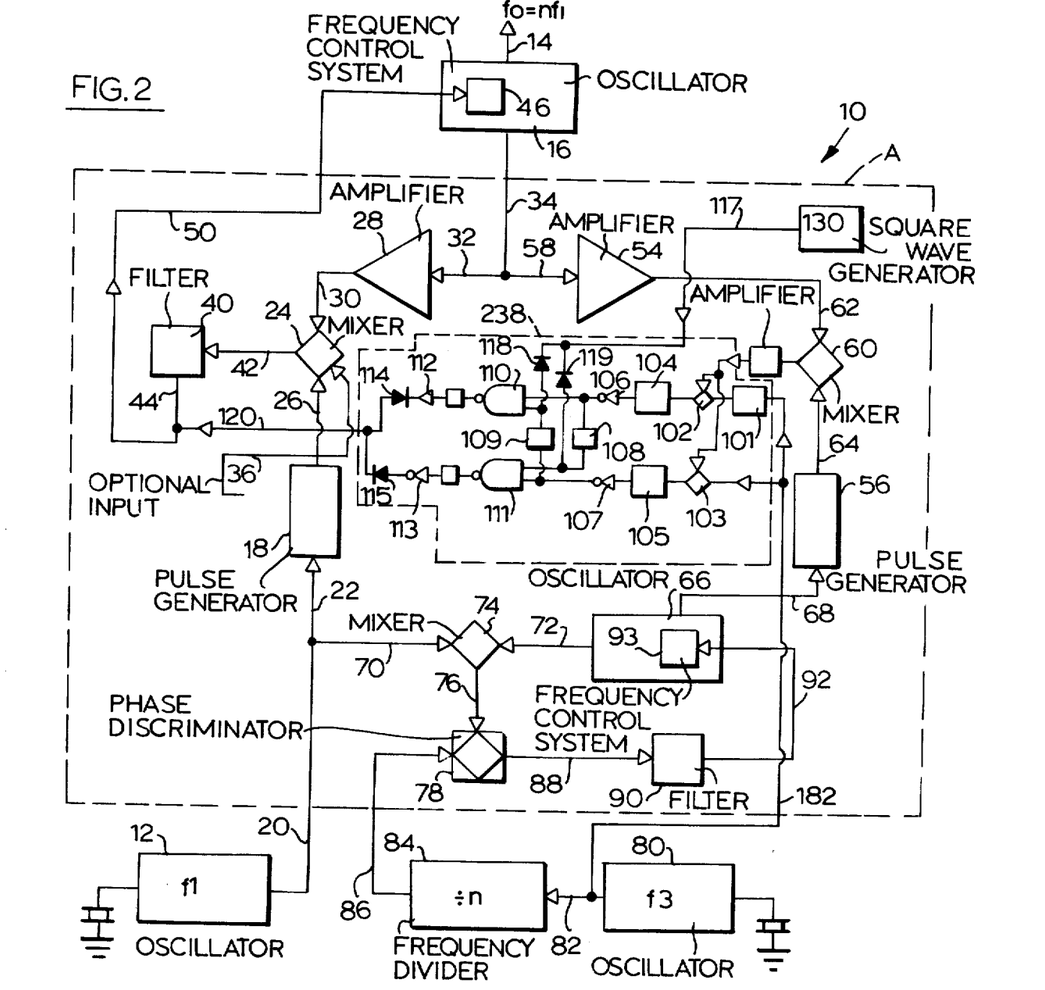
FIG. 2 is a diagram of a similar synthesizer to that of FIG. 1, embodying a frequency-discriminator in accordance with the present invention.

The system, disclosed in the block diagram of FIG. 2 indicates the condition that the beat frequency created in the mixer 60 is lower than $f_3$ for harmonics of the basic spectrum with a lower harmonic number than n, while for a harmonic number higher than n the best frequency is higher than the frequency $f_3$. For the harmonic n both the beat frequency and the reference frequency are equal to $f_3$. This condition is independent of the value of $f_3$ and remains valid even if $f_3$ would be variable.

This condition is applied in embodiments of the invention which relate to the U.S. Pat. No. 3,916,334 of Oct. 28, 1975, entitled: "Frequency Synthesizer using spectrum shift interpretation."

Figure 1:
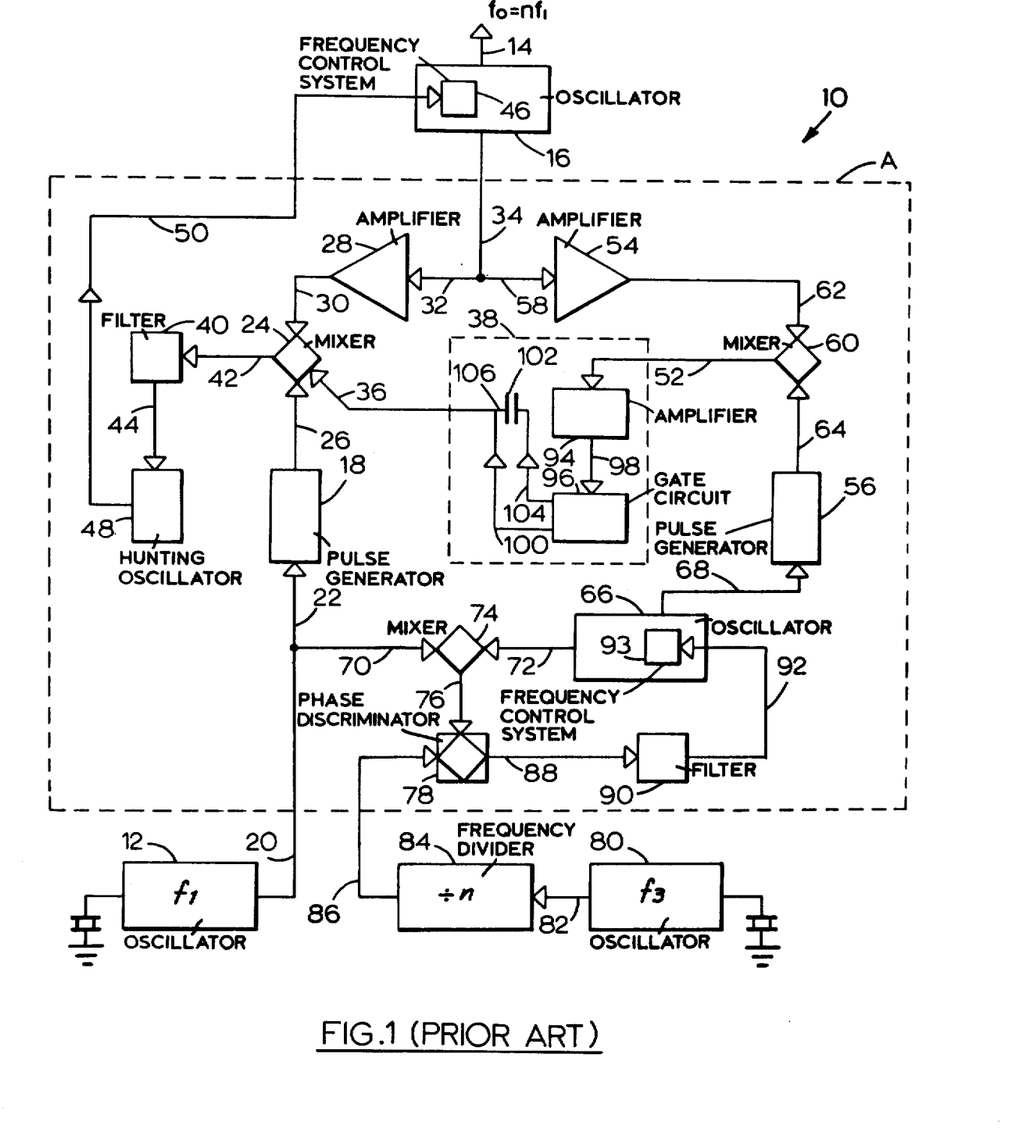
FIG. 1 is a block diagram of a frequency synthesizer system in accordance with the referred-to prior art.
Figure 7:
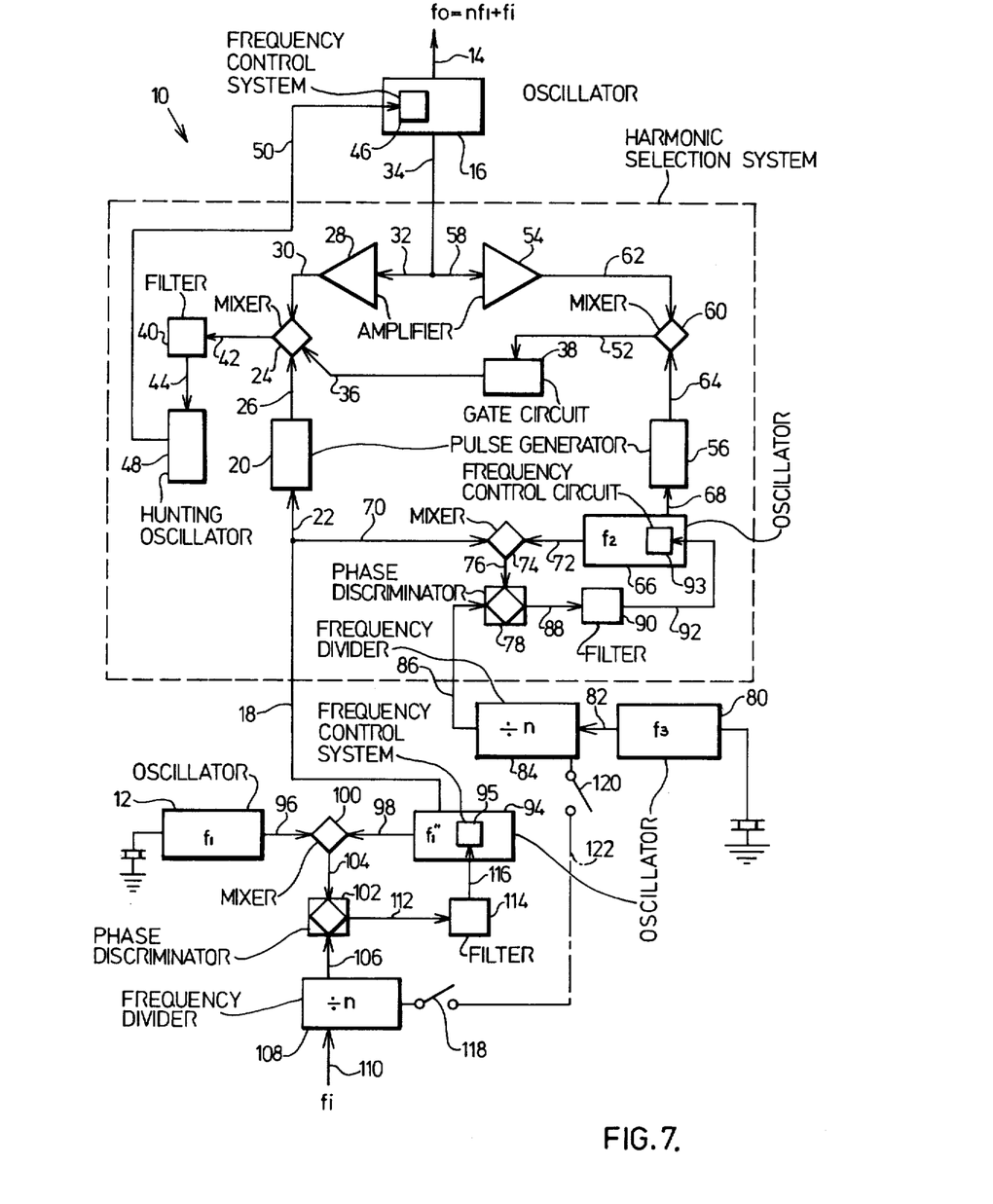
FIG. 7 shows a block diagram representing the prior art of the U.S. Pat. No. 3,916,334, and is identical to the FIG. 1 of the referred to patent.

The prior art of FIG. 1 of the referred to U.S. patent is shown in FIG. 7 of the present disclosure.

Figure 8:
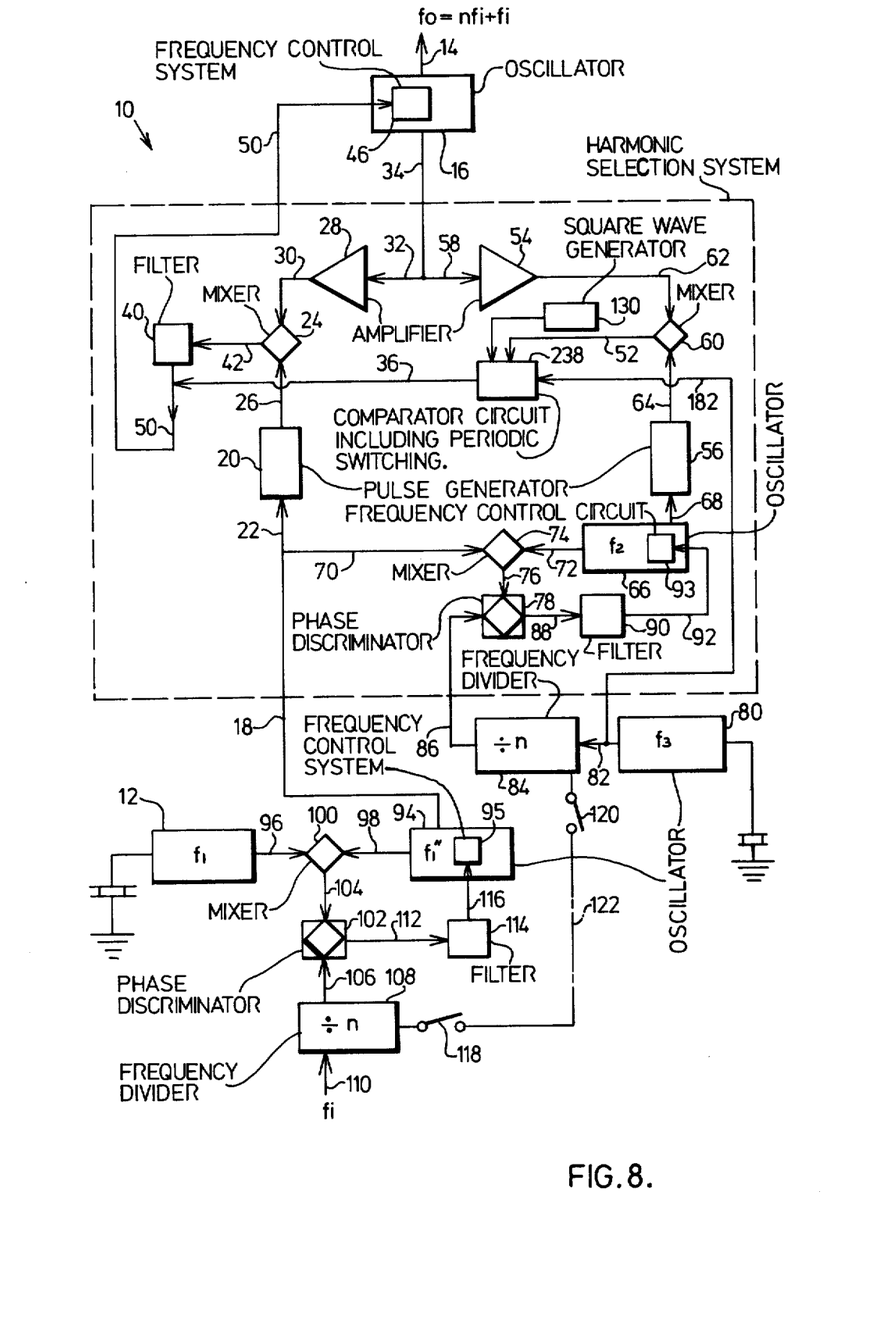
FIG. 8 shows an embodiment which incorporates the system of the present invention in the arrangement of the block diagram of FIG. 7.
Figure 9:
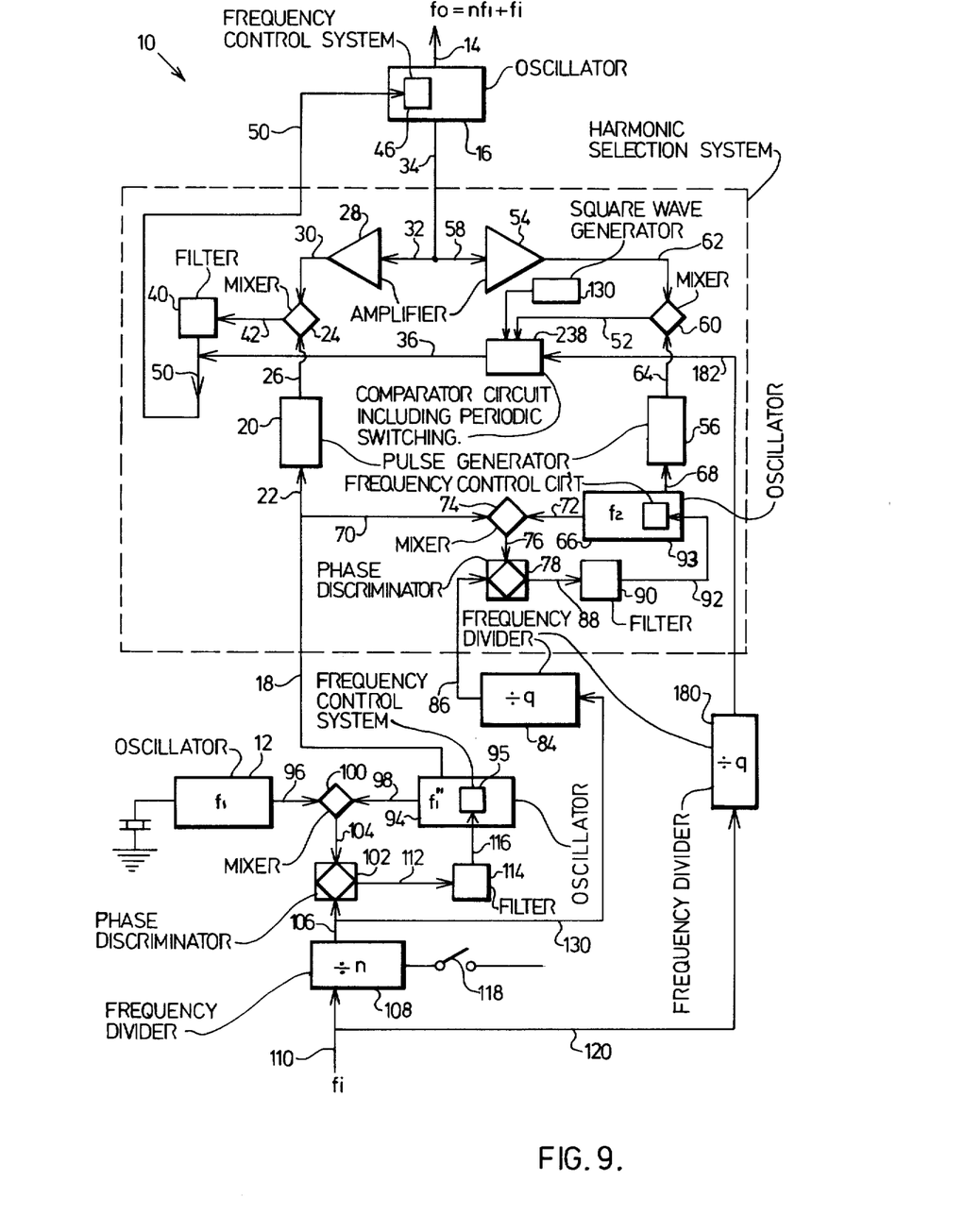
FIG. 9 shows a simplified embodiment of the system of FIG. 8 in which a fraction of the interpolation frequency $f_i$ is used instead of the offset frequency $f_3$, a system which results in the elimination of a programmed divider.
Figure 10:
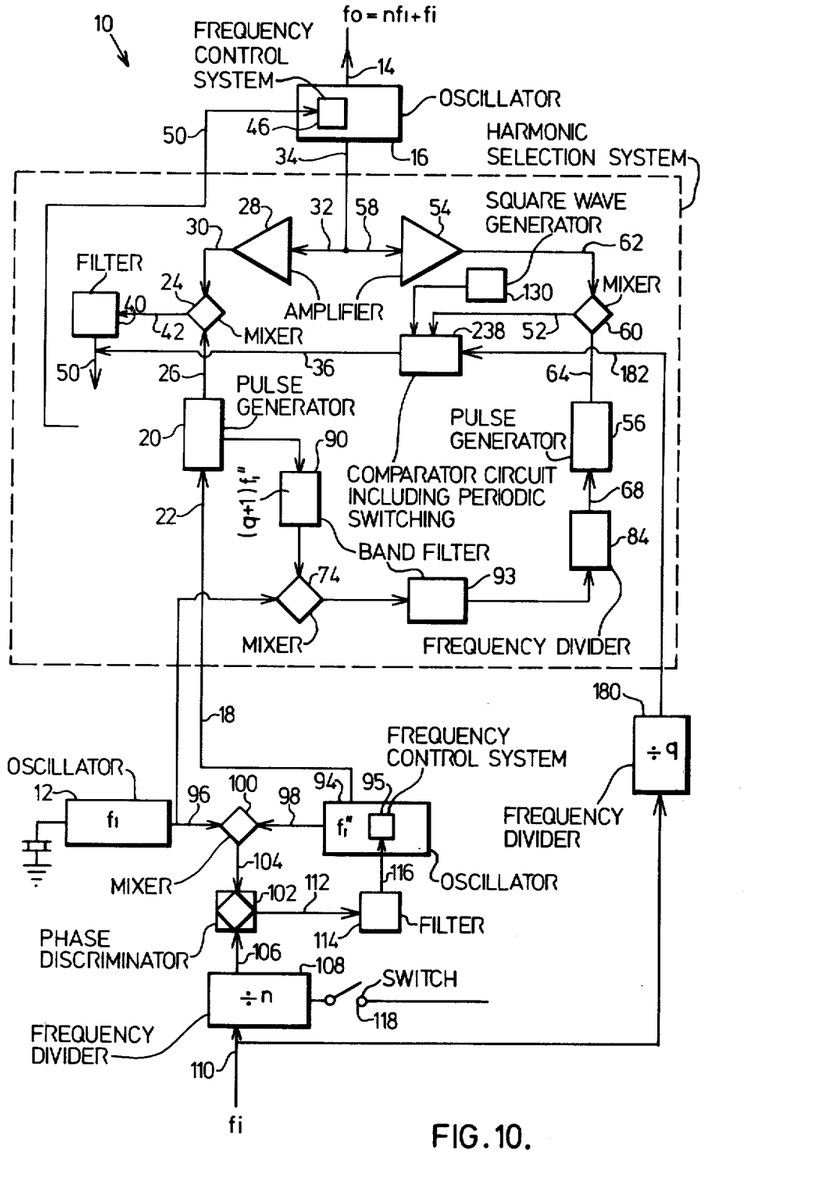
FIG. 10 represents a further simplified embodiment of FIG. 9 in which the fundamental frequency of the auxiliary spectrum is created by a mixing and filtering process instead of by means of a phaselocked oscillator system.

The figures following FIG. 7, being the FIGS. 8, 9 and 10, disclose various alternative embodiments of the present invention in relation with the system of U.S. Pat. No. 391 6334 as shown in the prior art FIG. 7.

The subject arrangements provide certain advantages over the disclosed prior art systems, namely it is simpler in concept and the condition of phaselock is not limited by the selectivity of a selective gate system, so that operation over a wider range, for higher harmonics, is made possible. These advantages accrue because the system dispenses with an accurately tuned frequency discriminator.

It will be appreciated that frequency-discriminators in accordance with the present invention may be utilized in suitable synthesizers other than those disclosed herein.

Certain embodiments of the present invention are described, reference being made to the accompanying drawings wherein.

The FIGS. 3,4,5, and 6 represent various alternative embodiment, operating in the block diagram FIG. 2..

FIG. 1 is the same as FIG. 1 of U.S. Pat. No. 3,904,980, incorporating a gate system 38 by means of which the condition of phaselock is controlled.

This prior art gate system 38 incorporates a tuned circuit having a constant resonance frequency $f_3$ operating a gate switching system, which in turn operates a mixer 24. The mixer 24 remains inhibited until an appropriate signal is supplied by the gate 38.

Referring to FIG. 2, a novel first discriminator embodiment is shown in place of the prior art gate system 38. The discriminator 138 receives an input signal from pulse mixer 60, a programming signal at frequency $f_3$ from the oscillator 80, and a lock-breaking signal by way of line 117 as further referred to below.

Figure 3:
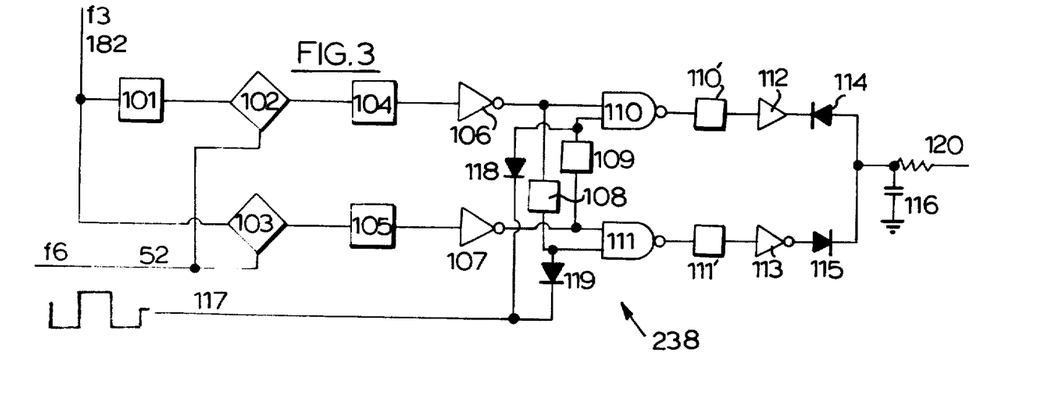

Turning more particularly to FIG. 3, the first discriminator embodiment comprises identical square wave mixer circuits 102 and 103 to which is connected oscillator 80 to provide a fixed frequency $f_3$ which remains substantially constant. A phase shifting network 101 changes by 90 degrees the phase of signal $f_3$ passing to mixer 102. Thus mixers 102, 103 receive signal components at frequency $f_3$ and having a 90 degree phase relationship, to provide a quadrature mixer system.

A pulse mixer 60, shown in FIG. 2 is connected to mixers 102, 103 by line 52 and provides a signal component at frequency $f_b$. The respective outputs from mixers 102, 103 are connected to identical integrating filters 104, 105 respectively and comprise the difference frequency between $f_b$ and $f_3$, which are fed to respective square wave amplifiers 106 and 107. Thus the respective outputs of amplifiers 106 and 107 consist of square wave signals with the difference frequency $f_b - f_3$, mutually displaced 90 degrees in phase.

The maximum value of frequency difference $f_b - f_3$ for which the system is operative is governed by the characteristics of filters 104 and 105.

It will be understood by those skilled in the art, in this case of this quadrature mixing arrangement that when $f_b$ is greater than $f_3$ the output signal of amplifier 106 has a 90 degree phaselead over the output signal of amplifier 107, and vice versa.

The output signals from amplifier 106 are connected to feed one input of a dual input NAND gate 110 and a differentiating network 108.

The differentiating network is designed to provide a short positive pulse during the positive transition of the output signal from amplifier 106.

This pulse signal is fed into the second gate input of the NAND gate 111.

The output signal of the amplifier 107 feeds direct into the first gate input of gate 111, while a component of the output of amplifier 107 also feeds into a differentiating network 109, which is identical to network 108 and which feeds its positive output signal pulse into the second input of NAND gate 110. Consequently the gate 110 receives a direct output signal of amplifier 106 in conjunction with a positive transition pulse from the output of amplifier 107.

Similarly the gate 111 receives a direct signal from the output of amplifier 107 in conjunction with a positive transition pulse from the output of amplifier 106.

For a phaselead condition of the output of amplifier 106 over the output of amplifier 107, the positive transition pulse due to the output of amplifier 107 corresponds with a positive value of the output of amplifier 106 and consequently this combination creates a negative output pulse from the gate 110.

From NAND gate 111 however since the signal from amplifier 107 has a phaselag with respect to the signal from amplifier 106, the positive pulses coincide with a negative condition of the amplifier 107 signal and consequently the gate 111 will not provide any output signal.

Conversely for a condition where the 107 signal has a phaselead over the 106 signal (for $f_b$ less than $f_3$ in our example) gate 111 will provide output pulses while gate 110 remains inactive.

For a very low difference in frequency of $f_b$ and $f_3$, the pulse output of the differentiating networks will decrease, leading to the condition of no output signal from either gate, as is the condition for equality of $f_3$ and $f_b$.

The values of the differentiating networks 108 and 109 are selected to assure that for a phaselock on a harmonic adjacent to the preselected one at either end of the range of the variable oscillator, sufficient pulse output signal is present, to assure that the related gate is being actuated.

The output pulses from the gates 110 and 111 are fed via two integrating networks which increase the pulse width, into the amplifiers 112 and 113 respectively.

The amplifier 112 is non-inverting while amplifier 113 is inverting. As a result the output of 112 consists of negative pulses while the output of 113 consists of positive pulses.

The output signals of 112 and 113 are fed via the diodes 114 and 115 into an integrating capacity 116, which in turn feeds its voltage into the frequency control system of the controlled oscillator 16 by way of line 120.

In order to periodically interrupt the discriminator output signal during which interruption the main oscillator 16 has an opportunity to phaselock on a spectrum harmonic, two clamping diodes 118 and 119 are provided. These diodes disable the output signals of the differentiating networks 108 and 109.

The clamping diodes 118 and 119 are actuated by a square wave signal of appropriate frequency and duty cycle to assure alternating discriminator output voltage pulses and phaselock of the main oscillator on a spectrum harmonic.

The square wave signal is supplied via line 117 and may be provided by an independent multivibrator or may be derived from one of the fixed divider systems, such as frequency divider 84 which provides a reference signal for the synthesizer.

It should be noted that the number of charge pulses per cycle of the square wave signal fed by the discriminator system into the integrating capacitor 116 increases with the frequency difference $f_b - f_3$. As a result the control voltage will increase for increased frequency differences.

In some synthesizers, which incorporate a fast acting control loop, the possibility exists that the sudden introduction into the control loop, of the output voltage of the discriminator-circuit of FIG. 3, is insufficient to assure a breaking of the existing phaselock of the main oscillator on a harmonic different from the preselected one.

Such a condition would prevent the oscillator frequency from moving to a following spectrum harmonic in the direction of the preselected one.

Figure 4:
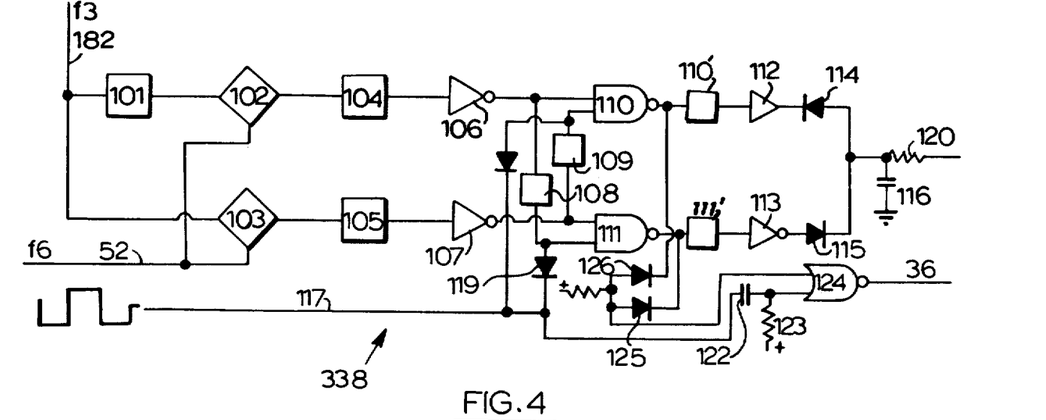
FIG. 4 is a block diagram of an alternative embodiment in which elements have been added to assure that at the end of each on position of the periodic switching operation described, the phaselock will be broken as long as the desired harmonic has not been reached.

The block diagram of FIG. 4 indicates an alternative to the arrangement of FIG. 3, in which alternative additional circuit elements are incorporated, which assure that as long as the preselected harmonic frequency is not reached, the phaselock of the main control loop is interrupted at the end of each positive cycle of the signal on line 117.

In FIG. 4, the circuit elements indicated with the numericals 101 through 119 inclusive are identical to the equal numbered circuit elements of FIG. 3 and consequently the related discriminator action is identical to that of the circuit of FIG. 3 and therefore will not be described in detail.

The additional circuitry which is to assure the breaking of the phaselock on an unwanted harmonic, is composed of the circuit elements 121 through 127 inclusive.

In this additional circuit arrangement one input of the NOR gate 124 is normally retained positive through the resistor 123. The second input of gate 124 is held negative when negative pulses are present on either the output of gate 110 or 111 respectively. These negative pulses are rectified by the diodes 125 and 126, thus creating a negative charge on capacitor 127 which retains the gate input negative.

In this condition the output of gate 124 remains negative due to the positive input voltage of the first gate input, from resistor 123 as indicated above. Resistor 123 is part of a differentiating network, comprising capacitor 122 and resistor 123. This network receives a square wave input signal from line 117. Consequently this differentiating network creates positive and negative pulses during the transistions of the square wave signal.

The positive pulses are absorbed by the presumed clamping diode on the input of the gate circuit. However the negative going transition pulses create positive going pulses in the output of gate 124. These positive pulses are fed through line 36 to an inhibit arrangement in the pulse mixer 24 of block diagram FIG. 2. This inhibit arrangement is described in the prior arts patent cited. It interrupts operation of the pulse mixer for the duration of the positive pulse on line 36, thus breaking the phaselock of the control loop operated by the pulse mixer. The output of gate 124 is present only as long as the second input of gate 124 is negative due to the presence of rectified negative pulse signals through the diodes 125 or 126. Should both pulse signals of the gates 110 or 111 disappear, which is the condition for $f_b$ equal $f_3$ when the desired phaselock is reached, then the second input of gate 124 becomes positive and the output of gate 124 remains negative for as long as this desired condition sustains.

Consequently this condition, indicating the required phaselock serves to terminate the inhibit pulses.

Figure 5:
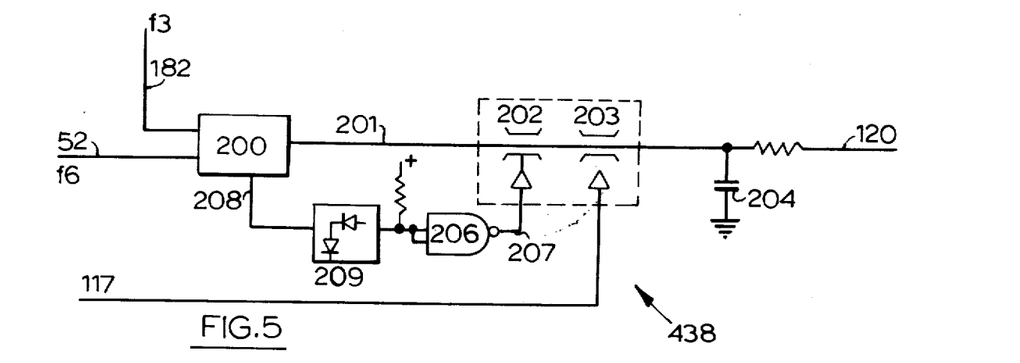
FIG. 5 is a block diagram of a third embodiment utilizing a comparator discriminator.

In FIG. 5 a further embodiment of the invention according to a modification of the first system is shown.

Various types of comparator discriminators can by used for this purpose. The particular example illustrated is based on the use of a comparator-discriminator as used in the Phase-locked Loop Integrated Circuit type CD 4046, originally developed by RCA. The following referred-to numerals constitute the numbered terminals of the Integrated Circuit assembly in the Dual in Line Package configuration.

The CD 4046 Integrated Circuit package contains a mixer type phase-discriminator, a comparator type phase-frequency discriminator and a controlled oscillator circuit.

The controlled oscillator circuit is not used in the application of FIG. 5.

The phase-discriminator and the comparator-discriminator have common input signal terminals (terminals 3 and 14). The phase-discriminator output is on terminal 2. For the comparator-discriminator the control output is on terminal 13, while an additional "loss of lock" indicating function operates through terminal 1.

The operation of the comparator-discriminator is such that for a significant difference in frequency between the input signals, the output signal consists of a positive or negative voltage (dependent on the relative frequency position of the input signals). As a synchronous condition between the input signals is approached, the constant voltage changes to periodic pulses which become narrower as the synchronous condition is approached.

When synchronism is reached, narrow positive or negative output pulses still remain, dependent on the phase relation of the (synchronous) input signals. These pulses narrow further down as the condition of coincidence of the positive transitions of the input signals is approached and the pulse signal disappears when the actual coincidence of the transitions is reached.

The loss of lock output through terminal 1 provides a normally positive voltage which incorporates negative pulses as long as no synchronism is reached, while the negative pulses disappear when synchronism is reached.

For more detailed information on this integrated circuit assembly may be referred to the application information of various Integrated Circuit manufacturers.

In FIG. 5 the Integrated Circuit (IC) assembly is indicated by reference number 200.

The discriminator output, via terminal 13, feeds via line 201 to two bilateral gate switches 202 and 203 which are arranged in series. After passing through these switches the discriminator output signal feeds to an integrating capacitor 204, which in turn is connected with the control circuit of the main oscillator by way of line 120.

The bilateral gate switch 202 is actuated by way of line 207, driven by the inverter 206 which in turn is actuated by a rectifier system 209. This rectifier system 209 is fed from the unit 200 either by the integrated output signal of the phase-discriminator (terminal 2) or by the negative "loss of lock" pulse system supplied via IC terminal 1.

The "loss of lock" approach via terminal 1 of the IC is somewhat simpler in concept, but the use of the integrated phase-discriminator output signal via IC terminal 2, permits control of the beat frequency range over which the gate is inactive and thus provides protection against occasional phase disturbances in the main control loop.

The second bilateral gate switch 203 is periodically activated by a periodic square wave gate switch signal supplied via line 117.

The operation of this system is such that, as long as the input signals $f_b$ and $f_3$ are different, the discriminator provides a control signal which, when applied to the control system of the main oscillator, moves the oscillator frequency in the direction of the preselected frequency.

During this period the gate switch 202 is enabled by the rectified signal feeding into the inverter-amplifier 206. The output signal of the comparator-discriminator feeds to the integrating capacitor 204 via the periodic switched gate 203. This moves the oscillator frequency through a succession of locked conditions towards the preselected value.

Once the preselected value is reached, the discriminator output remains in a neutral condition and at the same time the gate 202 switches off, thus assuring that no further change occurs in the locked condition.

Should the condition of the main control loop require a lock-breaking action, the requisite signal can be provided by introducing a dual input NAND gate, which is fed at one input by the output signal of gate 206 and at the other input by a positive transition pulse differentiated from the signal on line 117.

In cases where the frequency of the output signal of the pulse mixer 60 differs substantially from the value of $f_3$, the difference frequency signal may not pass through the amplifier system 106 and 107 to which mixer 60 is connected.

This would result in an absence of the $f_b$ signal which would result in a signal condition on line 208, similar to the condition of a phaselock on the required harmonic. As a result the oscillator frequency would remain locked in on an undesired harmonic frequency.

Figure 6:
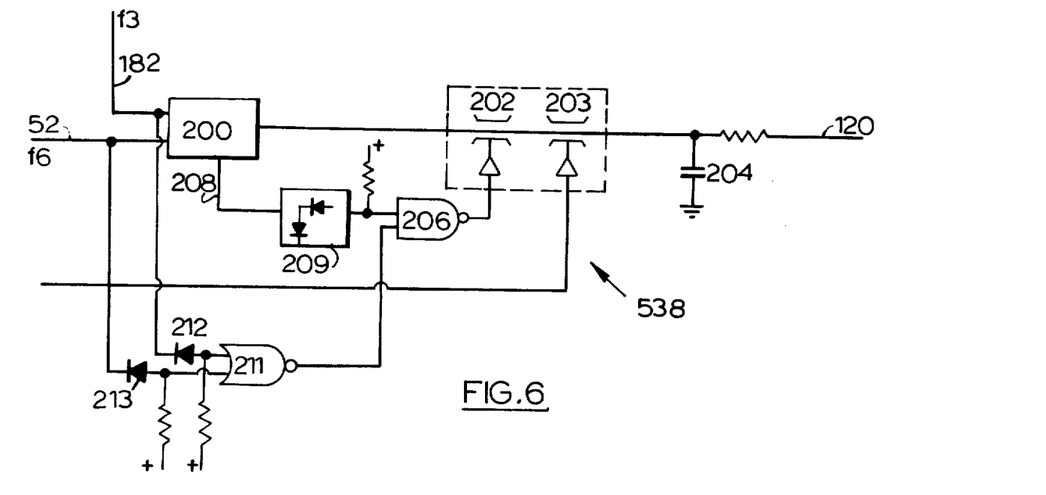
FIG. 6 is a block diagram of an alternative embodiment of the system of FIG. 5, provided with additional circuit elements to assure that, in case one of the two input signal components feeding into the discriminator system should disappear, this should not represent an apparent condition of a lock on the predetermined harmonic frequency.

In FIG. 6, an alternate arrangement to that of FIG. 5 is provided which incorporates additional circuit elements intended to create a protection against the described possibility of a lock-in on a wrong harmonic frequency.

In FIG. 6 the circuit elements indicated by the numericals 200 through 209 are identical to the equal numbered elements of FIG. 5 and these circuit elements perform identical functions as in FIG. 5.

Consequently the operation of the area of the circuit involved will perform the same function as that of FIG. 5 and therefore this will not be discussed in detail.

The additional circuit arrangement to prevent a possible false lock is included in the circuit elements 211 through 213 inclusive.

In this arrangement the inverter gate (NAND gate) 206 is arranged with two separate inputs, which were interconnected in FIG. 5. The additional elements consist of the dual input NOR gate 211, the rectifier diodes 212 and 213.

The diode 213 is fed by the signal component from the mixer 60, having the frequency $f_b$, while the diode 212 is fed by the reference signal with frequency $f_3$ provided by line 52. When both signals with the frequencies $f_b$ and $f_3$ are present at sufficient level, the negative rectified voltages of both diodes 212 and 213 will render the output of gate 211 positive. This enables the amplifier NAND gate 206 to perform as described for FIG. 5. Should however one of the signals feeding to the diodes 212 or 213 disappear, then this would result in a negative output voltage of gate 211 which operating on the second input of NAND gate 206 prevents the output of this gate from becoming negative. As a result the discriminator system including the periodic switch remains connected with the control system of the main oscillator as long as this condition pertains. Consequently no sustained false lock on an undesired harmonic can occur.

FIG. 7 shows the prior art of the U.S. Pat. No. 3,916,334. This block diagram is identical to the FIG. 1 of the referred to U.S. patent.

In this block diagram the section indicated as 10 is identical to the section 10 in the block diagram of FIG. 1 of the present disclosure except that the functional numbers 18 and 20 are interchanged between 1 and FIG. 7.

The system of the block diagram of FIG. 7 is described in detail in the U.S. Pat. No. 3,916,334 in relation to the FIG. 1 of that patent.

In relation to FIG. 1 of the present disclosure, the input signal into line 20 of FIG. 1 is in FIG. 7, replaced by an input signal with frequency $f_1''$, feeding into line 18 of FIG. 7. The frequency $f_1''$ is variable over a limited frequency range in order to perform the interpolation function.

The signal with the frequency $f_1''$ is provided by a controlled oscillator which has an offset in frequency equal to $f_i/n$ from the basic spectrum frequency $f_1$.

Consequently $f_1' = f_1 + f_i/n$.

In this form $f_i$ represents the interpolation frequency which is variable over a range equal to the basic spectrum frequency interval $f_1$.

As discussed in detail in the prior art patent the interpolation frequency may be created in a separate phaselocked oscillator which is locked in smaller frequency steps.

In FIG. 8 the selective gate system 38 of FIG. 7 is replaced by the comparator system 238 operating in conjunction with a periodic switch actuated by the square wave generator 130 as long as the equality condition of the signals entering the comparator has not yet been reached. The periodic switch connects the output voltage of the comparator, stored in a capacitor periodically with the control line 50 of the output oscillator 16.

The polarity of the comparator output voltage is such that for a phaselock of the output oscillator on a spectrum harmonic of the $f_1''$ which has a lower number than the required value n, then the output voltage of the comparator will be positive going, which through the periodic switching will move the phaselock of the output oscillator to a higher harmonic value until the desired harmonic n is reached.

Was the output oscillator frequency phaselocked on a higher harmonic number than n, then the comparator would provide negative going voltage pulses through the periodic switching system until the value n would be reached.

Once the value n is reached the periodic switching is terminated as long as the comparator receives equal input frequency values. The two compared input signals of the comparator are provided by the $f_3$ oscillator 80 by the pulse mixer circuit 60. The comparator system according to the present invention may also be applied in a synthesizer system, according to FIG. 8, but in which divider 84 has a fixed dividing ratio, while a variable divider is inserted in line 182.

In this arrangement the variable divider is programmed for divider ratio's reciprocal to the harmonic number of the basic spectrum on which a phaselock is required.

FIG. 9 represents an alternative circuit to that of the block diagram of FIG. 8.

In FIG. 9, the signal $f_3$ of oscillator 80 is replaced by a signal component ($f_i/q$) derived from the f signal by a fixed divider 180.

Since a signal with the frequency ($f_i/n$) is already present in the output of divider 108, the signal with a frequency ($f_i/n\cdot q$) to be fed into line 86 is derived from the output of divider 108 by means of a second fixed divide by 9 divider 84, which feeds into line 86.

For clarification the system of FIG. 9 will be discussed in detail:

The input interpolation signal f, provided by an interpolation oscillator, not shown, varies in frequency over a range $f_1$.

This interpolation signal is fed into the line 110. One component of this signal is fed to the fixed divider by q divider 180, which in turn feeds its output signal with the frequency ($f_i/q$) into the comparator 238.

Another component of the $f_i$ input signal feeds into the programmed divide by n divider 108 via line 106 to the phase discriminator 102 as a reference signal with the frequency ($f_i/n$). Another component of this ($f_i/n$) signal feeds the fixed divide by q divider 84. The output signal of the divider 84, with the frequency ($f_i\cdot n\cdot a$) is fed via line 86 as a reference signal into phase-discriminator 78. The basic spectrum frequency $f_1$, representing the largest intervals in the system, is created in the oscillator 12 and is fed to the mixer 100 via line 96.

The controlled oscillator 94 feeds a signal with the frequency $f_i$ into the mixer 100, where it is mixed with the $f_1$ signal resulting in the difference frequency $f_1'' - f_1$ which is fed to the phase-discriminator 102. The output control voltage of 102 is fed via line 112, filter 114 and line 116 to the control circuit of oscillator 94. As a result of this arrangement a phaselock is created of oscillator 94 on the reference frequency of phase discriminator 102 via mixer 100. The reference frequency is ($f_i/n$) and as a result the oscillator frequency of 94 is phaselocked on value $f_1'' = f_1 + f_i/n$.

An output signal component of the oscillator 94, with the frequency $f_1''$ is fed as fundamental frequency to the pulse generator 20.

The output pulses of 20 are fed into the pulse mixer circuit 24 where they are compared with a signal component from the output oscillator, provided via the separator amplifier 28.

As a result the output oscillator frequency will be phaselocked on a harmonic of the $f_1''$ spectrum.

Another component of the $f_1''$ signal provided by oscillator 94 is fed into the mixer 74, where this signal is mixed with a signal component from the oscillator 66, which provides the fundamental frequency signal with the frequency $f_2$ for the auxiliary spectrum system.

The difference frequency $f_2 - f_1''$ is fed by mixer 74 via line 76 to the phase-discriminator 78. This phase-discriminator receives the reference frequency signal with frequency ($f_i/n\cdot q$) via line 86. The control output signal of 78 feeds via line 88, filter 90 and line 92 into the control circuit of oscillator 66.

As a result of this arrangement the frequency $f_2$ of oscillator 66 is phaselocked on a value $f_2 = f_1'' + (f_i/n\cdot q)$ which frequency is the fundamental frequency of the auxiliary pulse spectrum.

This signal $f_2$ feeds into the pulse generator 56 which in turn feeds into the pulse mixer 60, which receives a component of the signal of the oscillator 16 via the separator amplifier 54. The beat output signal created in pulse-mixer 60 is fed to the comparator 238 via line 52.

Were the output oscillator frequency phaselocked on the harmonic of the $f_1''$ spectrum, then its frequency would be $p\cdot f_1''$.

The nearest harmonic of the $f_2$ spectrum in mixer 60 would have a frequency $p\cdot f_2$ or $p\cdot f_1'' + p/n \cdot f_i/q$. As a result the beat frequency created in mixer 60 would have a frequency $p/n\cdot f_i/q$, which signal feeds into the comparator 238.

The reference signal for the comparator fed via line 182 has a frequency $f_i/q$.

For q lower than n the comparator will provide a positive output voltage, which via the periodic switching system, would result in the injection of positive pulses in the control line 50 of oscillator 16. These positive voltage pulses result in a jumping of the oscillator frequency of a phaselock on higher harmonic numbers than p of the $f_1''$ spectrum, until the value n is reached.

At that time both input signals for the comparator are equal in frequency, resulting in a termination of the periodic pulses and a consolidation of the phaselock on this harmonic n.

FIG. 10 represents another alternative embodiment of the invention.

In the block diagram of FIG. 10 the fundamental frequency $f_2$ of the auxiliary spectrum is created by means of a mixing and filtering process instead of by means of a phaselocked oscillator.

In the block diagram of FIG. 10 as in FIG. 9 a component of the $f_i$ signal, divided by q is fed as reference signal into the comparator 238 via line 182.

The signal $f_1''$ created in oscillator 94 is fed as fundamental frequency into the pulse generator 20 via line 22.

One component of the pulse output signal of the pulse generator 20 is fed to the pulse mixer 24 via line 26. In pulse mixer 24 the pulse signal is combined with a signal component from the output oscillator provided via the separator amplifier 28. The output signal of pulse-mixer 24 feeds via line 24, filter 40 and line 50 to the control circuit of the output oscillator 16.

This arrangement similar to that in FIG. 9, provides a phaselock of the frequency of the output oscillator on a harmonic of the $f_1''$ spectrum.

A component of the pulse signal created in the pulse generator 20 is fed to the bandfilter 90.

This bandfilter is tuned to the harmonic $(q+1)\cdot$ of the $f_1''$ spectrum. The filtered signal with the frequency $(q+1)\cdot f_1''$ feeds to the mixer 74. In mixer 74 the signal is mixed with a signal component of the basic frequency signal $f_1$.

The difference component of both signals created in the mixer 74, having the frequency $(q+1)\cdot f_1'' - f_1$ is filtered out by the following filter 93, and is fed to the divide by q divider 84. Since $f_1'' = f_1 + f/n$ or $f_1 = f_1'' - f/n$ the output frequency of the divider will be $f_2 = q\cdot f_1'' + (f_i/n)/q$ or $f_1'' + f_i/n\cdot q$ which is equal to the $f_2$ value as it appeared in the system of FIG. 9.

This $f_2$ signal is fed via line 68 to the pulse generator 56 to represent the fundamental frequency of the auxiliary spectrum. Consequently the operation of the channel selection system is identical to that of FIG. 9.

For further clarification a numerical example may be given for the system of FIG. 10.

Assumed is a synthesizer which is to provide within the frequency range from 40 to 60 MHz a signal which is created in 1 MHz intervals with interpolation over 1 MHz. The details of the interpolation signal are not included in this example.

To achieve this result the following values are used:

$$f_1 = 1 \text{ MHz}$$

$f_i$ varies from 2 to 3 MHz.

The divider ratio n of the divider 108 varies from 38 to 57, while the fixed divider ratio q = 8.

Based on these values the signal on line 182, being $f_i/8$ varies from 250 to 375 kHz.

The signal on line 106 being $f_i/n$ varies from 35.0877 to 78.947 kHz. These figures also represent the offset frequency between $f_1''$ and $f_1$. Consequently the frequency $f_1''$ varies from 1035.0877 to 1078.947 kHz. The frequency range filtered out by the filter 90 varies over 9· $f_1''$ and consequently covers the frequency range from 9315.7893 to 9710.523 kHz.

The frequency passing through the bandfilter 93, being 9· $f_1'' - f_1$, varies from 8315.7893 to 8710.523 kHz.

As a result the frequency $f_2$, being the output frequency of the divide by 8 divider 84, covers the range from 1039.4737 kHz to 1088.8153 kHz.

Assuming that an output frequency of 57.30 MHz is selected for the synthesizer.

For this frequency the divider ratio n is 55, while the interpolation frequency $f_i = 2300$ kHz.

For this case $f_1'' = 1000 + 2300/55$ kHz or $f_1'' = 1041.81818$ kHz, the frequency passing through the filter 90 is 9376.3636 kHz and the input signal for divider 84 is 8376.3636 kHz, resulting in a value $f_2 = 1047.04545$ kHz.

The output signal, being 55 · $f_1''$ is $f_0 = 57300$ kHz, while the 55th harmonic of the $f_2$ spectrum is 57587.500 kHz, resulting in a beat frequency of 57587.500 − 57300 kHz or 287.5 kHz., which signal enters the comparator 238.

The signal on line 182 is $f_i/8$ or 2300/8 = 287.50 kHz, which is equal to the signal on line 52.

With reference of the description of the FIG. 10 embodiment having components to provide mixing and filtering in place of a phaselocked oscillator, the described embodiment utilizes the q+1 harmonic. However to one skilled in the art it will be evident that the q−1 harmonic may be just as readily selected, in which case after mixing with the $f_1$ signal the upper image of the mixing product would be selected instead of the previously recited selection of the lower image. The respective selected image signals are then divided by the listed value q.

It will be evident to one skilled in the art that selection of a frequency offset may just as readily be provided in a negative sense as in the disclosed positive sense without in any way departing from the present invention.

The embodiment illustrated in FIG. 10 is preferred over the other illustrated embodiments because it is simpler, in eliminating a phaselocked loop, and thereby eliminating a source of potential problems.

In the case of the alternative comparator circuits illustrated in FIGS. 3, 4, 5 and 6 no particular one is preferred as of the date of writing, although development work may produce evidence to support the superiority, lower cost and greater reliability of one embodiment over another.

What I claim is:

1. In a phaselock device, having a variable first oscillator, to be phaselocked to a predetermined harmonic of a second signal source having a frequency spectrum, the improvement comprising a comparator discriminator control system to move the frequency of said first oscillator from a condition of phaselocked coincidence with one said harmonic frequency to another said harmonic frequency, comprising: a source of an offset frequency; a frequency divider having a dividing ratio related to the harmonic number of said predetermined harmonic to which phaselock is desired; control means to control the frequency of a third signal source having a frequency spectrum, capable of controlling the third signal source frequency to such a value that the difference in frequency between the second source frequency and the third source frequency is equal to the output frequency of said frequency divider, said output frequency having a value equal to said offset frequency divided by the dividing ratio of said divider; mixing means for mixing the spectrum of the third spectrum signal source with a component of the signal of said first oscillator, to create as an output signal of said mixing means a beat frequency equal to the difference between the first oscillator frequency, coinciding with a harmonic of the second source spectrum, and a nearby harmonic of the third source spectrum; filter means to filter out said frequency, comparator-discriminator means connected to the filtered beat output signal and to the source of the offset frequency, integrating means to integrate the output signal of said comparator-discriminator to compare the relative position of both-said signals, periodic switching means to periodically feed an integrated output signal of said comparator-discriminator into said frequency control system of said first oscillator and causing a break in the phaselock of the first oscillator frequency on a harmonic of the second source spectrum, when said beat frequency is higher than the offset frequency the discriminator output voltage being of such a magnitude and polarity as to decrease the frequency of the first oscillator, and when said beat frequency is lower than said offset frequency the output voltage of said comparator-discriminator is of such a magnitude and polarity as to increase the frequency of the first oscillator, and when said beat frequency is equal to said offset frequency the discriminator output retains a neutral condition in which it does not alter the voltage of the control system of the first oscillator, as long as the equality of both said frequencies is retained.

2. A phaselock device according to claim 1, wherein in said comparator-discriminator said neutral condition extends over a limited range of the difference in frequency between said beat frequency and said offset frequency, the range being such that the difference frequency limiting said range is substantially lower than the lowest difference frequency which would occur when said first oscillator frequency is phaselocked on a harmonic of said second source spectrum adjacent to said predetermined harmonic of the second source spectrum.

3. A phaselock device according to claim 1, wherein said neutral voltage condition of said comparator-discriminator is accomplished by means of a switching arrangement actuated by said beat signal component between both said input signals of the discriminator, said switching arrangement being connected to isolate the discriminator output from the control circuit of said first controlled oscillator when said beat signal disappears due to said equality of input signal frequencies.

4. A phaselock device according to claim 1 wherein said comparator-discriminator provides an output signal upon the occurrence of a change in state to create a loss of lock, the changed state occurring between a condition of equality and a condition of non-equality of the frequencies of said discriminator input signals, this change in state signal being applied to a switching arrangement to disable the operation of the discriminator output on said first oscillator control system, which occurs when the frequencies of both discriminator input signals are equal.

5. A phaselock device according to claim 3, said beat actuated switching arrangement being provided with an additional switching arrangement to prevent a disabling action when one or both said discriminator input signals are absent.

6. A phaselock device according to claim 1, including a switching arrangement to provide a periodic signal operating on said circuit arrangement to periodically disable the action of said discriminator to retain the neutral condition of said output signal when the discriminator is in the disabled mode.

7. A phaselock device according to claim 1, including a switching arrangement to disconnect the output signal of said discriminator from the control circuit of said first oscillator, said switching arrangement being actuated by a periodic signal being fed into the device.

8. A phaselock device according to claim 3 in which said beat actuated switching arrangement disables the periodic switched signal feeding to the comparator-discriminator arrangement in the condition when both input signals reach equality in frequency.

9. A phaselock device according to claim 1 having switching pulse means, creating a pulse coincident with the transition of periodic switching action from a disabled to an enabled state of said first oscillator control system, the switch-pulse arrangement being connected to said pulse mixing means controlling the phaselock of said first oscillator frequency to disable the operation of the pulse-mixer circuit during occurrence of the switching pulse, thus interrupting an existing phaselock of the first oscillator frequency on a harmonic of the second source pulse spectrum, the arrangement being such that the switching arrangement which disables the discriminator output signal from feeding into the oscillator control circuit, also disables the switching pulses.

10. The device according to claim 1 wherein said second signal source is variable, having a frequency range such that interpolation between two successive harmonics of said second signal spectrum is obtained within the frequency range of said variable first oscillator, said second signal being selected from the signal components comprising an upper image and a lower image, being respectively the sum and the difference of a primary reference signal and a signal component created by dividing the signal of an interpolation signal generator by an interpolation divider, having a divider ratio corresponding with the harmonic number of the predetermined spectrum harmonic on which the variable first oscillator frequency is to be phaselocked, said interpolation signal frequency being variable over a range which corresponds with the frequency interval between two harmonics of the primary reference signal.

11. A phaselock device according to claim 10, in which said offset frequency source is variable, having an output frequency as a fixed fraction 1/q of the variable interpolation frequency created in said interpolation signal source and in which the divided offset frequency, serving as a reference signal source for the phaselock of the third signal source is derived by a fixed 1/q divider from the output of the variable interpolation frequency divider which divides the interpolation frequency, created in the interpolation signal source, while the offset frequency signal fed to said comparator-discriminator is derived from said interpolation signal source by a fixed 1/q divider.

12. In a phaselock device, having a first oscillator to be phaselocked to a predetermined harmonic of a second signal source having a frequency spectrum, the improvement comprising a comparator-discriminator control system to move the frequency of said first oscillator from a condition of phaselocked coincidence with harmonic frequency to a condition of phaselocked coincidence with another said harmonic frequency, comprising: a third signal source having a frequency spectrum, mixing means for mixing the spectrum of the third spectrum source signal with a component of the signal of said first oscillator, to create as an output signal from said mixing means a beat frequency equal to the difference between the first oscillator frequency, coinciding with a harmonic of the second source spectrum, and a nearby harmonic of the third source spectrum; filter means to filter out said frequency, comparator-discriminator means connected to the filtered beat output signal and to the output of a divide by q divider, which in turn receives its input signal from an interpolation signal source, said comparator-discriminator means provide comparison of the relative position of both said signals, integrating means to integrate the output signal of said comparator-discriminator, periodic switching means to periodically feed an integrated output signal of said comparator-discriminator into said frequency control system of said first oscillator to provide a break in the phaselock of the first oscillator frequency on a harmonic of the second source spectrum, when said beat frequency is higher than the divided interpolation frequency, the discriminator output voltage being of such a magnitude and polarity as to decrease the frequency of the first oscillator, and when said beat frequency is lower than the divided interpolation frequency the output voltage of said comparator-discriminator is of such a magnitude and polarity as to increase the frequency of the first oscillator, and when said beat frequency is equal to the divided interpolation frequency, the discriminator retains a neutral condition in which it does not alter the voltage of the control system of the first oscillator as long as the equality of both said frequencies is retained; said second signal source comprising a phaselocked oscillator, a source for a primary reference signal, a mixer circuit, a phase-discriminator circuit with associated control filter to provide a control voltage to the control circuit of said phaselocked oscillator, the mixer circuit providing an output signal with a frequency comprising the difference between said primary reference signal frequency and said phaselocked oscillator frequency, said difference frequency being fed to the phase discriminator, which phase-discriminator receives as a reference signal the output of a variable interpolation divider driven by said interpolation signal source, said interpolation divider being set for a divider ratio corresponding with the harmonic number of the preselected harmonic of the second signal source spectrum on which the first oscillator frequency is to be phaselocked, said phase-discriminator creating a phaselock of the frequency of the phaselocked oscillator on a selected mixing product of said primary reference signal frequency and the interpolation divider output frequency; said third signal source being composed of a bandfilter circuit fed by the frequency spectrum of the second signal source and said bandfilter being tuned on a harmonic with the frequency $q+1$ times the second signal source frequency, the output of said bandfilter feeding into a mixer circuit where this signal is mixed with a signal of the primary reference signal frequency, in which the output signal component consists of the difference between the value of $q+1$ times the second signal frequency and the primary reference frequency, this difference frequency being filtered out by a following bandfilter, and feeding to a divide by q divider, the output frequency of this divider providing the third signal source, the frequency of this third signal being the sum of the primary reference frequency and the interpolation frequency divided by nq, in which n is the harmonic number of said preselected harmonic of the second signal source spectrum.

13. The device as claimed in claim 12 wherein said selected mixing product comprises the sum of said primary reference signal frequency and said interpolation divider output frequency.

14. The device as claimed in claim 12 wherein said selected mixing product comprises the difference between said primary reference signal frequency and said interpolation divider output frequency.